(12) United States Patent
Miura

(10) Patent No.: US 6,401,225 B1
(45) Date of Patent: Jun. 4, 2002

(54) COMPARATOR CIRCUIT FOR SEMICONDUCTOR TEST SYSTEM

(75) Inventor: Takeo Miura, Tatebayashi (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/249,654

(22) Filed: Feb. 12, 1999

(30) Foreign Application Priority Data

Feb. 20, 1998 (JP) .......................................... 10-038717

(51) Int. Cl.⁷ ............................................... G01R 31/28
(52) U.S. Cl. ........................ 714/724; 714/819; 324/765
(58) Field of Search ................................ 714/724, 733, 714/734, 742, 745, 811, 819, 719, 727, 814–815, 736; 360/137; 73/105; 716/1, 6; 702/119; 340/514, 146.2; 324/765, 73.1, 158.1; 365/201; 327/18, 156; 326/105, 59

(56) References Cited

U.S. PATENT DOCUMENTS

| | | | | |
|---|---|---|---|---|
| 4,939,396 A | * | 7/1990 | Schoettmer | ................... 327/18 |
| 5,416,409 A | * | 5/1995 | Hunter | ..................... 324/158.1 |
| 5,659,553 A | * | 8/1997 | Suzuki | ........................ 714/736 |
| 5,760,599 A | * | 6/1998 | Ehiro | .......................... 324/765 |
| 5,792,947 A | * | 8/1998 | Pogrebinsky et al. | ......... 73/105 |
| 6,020,752 A | * | 2/2000 | Shimasaki | .................. 324/765 |

* cited by examiner

Primary Examiner—Phung M. Chung
Assistant Examiner—Guy Lamarre
(74) Attorney, Agent, or Firm—Muramatsu & Associates

(57) ABSTRACT

A comparator circuit includes a window high impedance detector which detects any glitches or fails in the high impedance state of the device under test (DUT) within a specified time range. The comparator circuit includes a first analog comparator for receiving an output signal of the DUT and comparing the output signal with a high threshold voltage, a second analog comparator for receiving the output signal of the DUT and comparing the output signal with a low threshold voltage, and a window high impedance detector for detecting a deviation from a high impedance state of the DUT throughout a specified time range and for producing a fail signal when the deviation is detected.

8 Claims, 6 Drawing Sheets

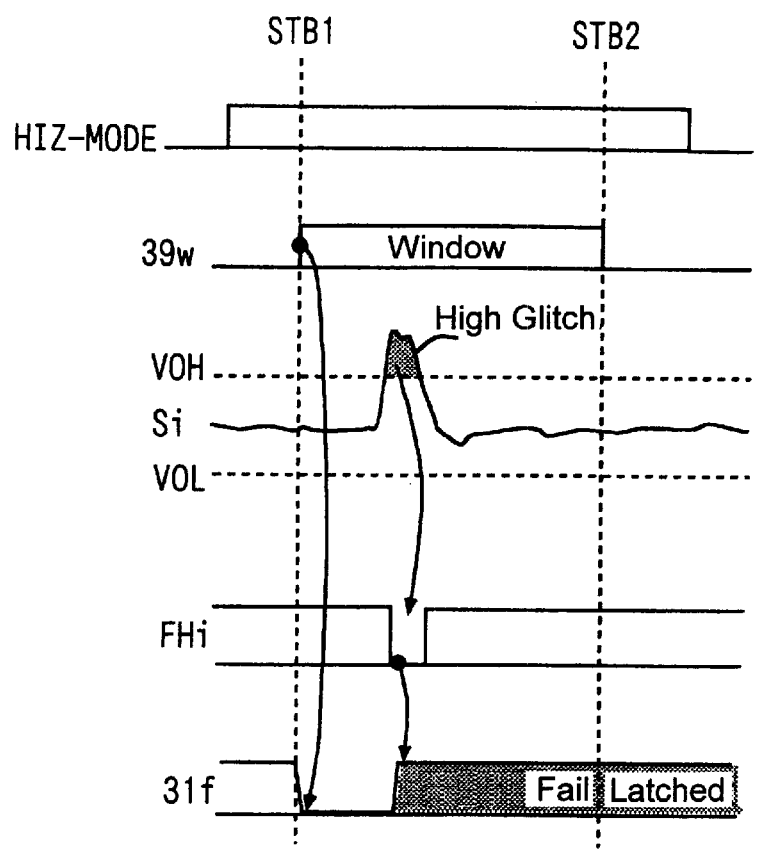

COMPARATOR CIRCUIT FOR SEMICONDUCTOR TEST SYSTEM

FIELD OF THE INVENTION

This invention relates to a semiconductor test system for testing semiconductor devices such as ICs and LSIs, and more particularly, to a comparator circuit to be used in a semiconductor test system for evaluating output signals of a semiconductor device under test when the semiconductor device output is in a high impedance state.

BACKGROUND OF THE INVENTION

In testing semiconductor IC devices by a semiconductor test system, such as an IC tester, a semiconductor IC device to be tested is provided with test signals at its appropriate pins at predetermined test timings. The IC tester receives output signals from the IC device under test produced in response to the test signals. The output (analog) signals are compared with predetermined threshold voltages by analog comparators to determine logical states thereof. The logical states in the output of the analog comparators are strobed, i.e., sampled by strobe signals with predetermined timings to be compared with expected logic data to determine whether the IC device functions correctly or not.

The present invention is directed to such an analog comparator and strobe circuit (collectively "comparator") for evaluating output signals of the semiconductor device under test. An example of the comparator in the conventional technology is shown in the block diagram of FIG. 5. The comparator circuit of FIG. 5 is comprised of mainly analog comparators and strobe (detector) circuits. The comparator of FIG. 5 is followed by a logic comparator (not shown) to determine whether the output signals of the comparator match the expected logical states (expected values).

In FIG. 5, the comparator includes analog comparators 10 and 20, a high timing detector 50, a window timing detector 70, a low timing detector, a high impedance (HIZ) detector 80, and selectors 91 and 92. The HIZ detector 80 includes a high level HIZ detector and a low level HIZ detector. The analog comparators 10 and 20 are provided with an output signal Si of the semiconductor device under test (DUT) at corresponding input terminals.

The analog comparator 10 is also provided with a high threshold voltage VOH to determine whether the output signal Si of the DUT is higher than the threshold voltage VOH, i.e., a logic "1" or "high". Thus, when the output signal Si of the DUT is lower than the threshold voltage VOH, the analog comparator 10 generates a fail signal FHi. The analog comparator 20 is also provided with a low threshold voltage VOL to determine whether the output signal Si of the DUT is lower than the low threshold voltage VOL, i.e., a logic "0" or "low". Thus, when the output signal Si of the DUT is higher than the threshold voltage VOL, the analog comparator 20 generates a fail signal FLi. As shown in FIG. 5, the outputs of the analog comparators 10 and 20 are respectively connected to the high timing detector 50, the window timing detector 70, the low timing detector 60, and the high impedance (HIZ) detector 80.

The high timing detector 50 is to detect whether there exists a high level fail at the timing of the strobe signal STB1. Thus, the fail signal FHi from the analog comparator 10 is latched by the edge timing of the strobe STB1, which is provided to the selector 91. The low timing detector 60 is to detect whether there exists a low level fail at the timing of the strobe signal STB2. Thus, the fail signal FLi from the analog comparator 20 is latched by the edge timing of the strobe STB1, and is provided to the selector 92.

The window timing detector 70 is to determine whether there exist any fails or glitches during a window period (time range) defined by the strobe signals STB1 and STB2. The window timing detector 70 is effective when a window strobe mode command "WINDOW-MODE" is active. Generally, a glitch is a very short unwanted high amplitude transient that recurs irregularly in an electric system. When any high level fails or high level glitches are detected within the window period, a high glitch detection signal 70/1 is produced at the output of the detector 70, which is provided to the selector 91. When any low level fails or low level glitches are detected within the window period, a low glitch detection signal 70/2 is produced at the output of the detector 70, which is provided to the selector 92.

The high impedance (HIZ) detector 80 is to determine whether the subject pin of the DUT is in a high impedance state at the timing of the strobe signals STB1 or STB2. The HIZ detector 80 is effective when a high impedance mode command "HIZ-MODE" is active. Many semiconductor devices are designed to be able to set a high impedance state for certain pins thereof when, for example, such pins do not function as I/O pins. In such a high impedance state of a pin, the semiconductor device is designed so that the output signal Si of the pin remains within the voltage range between the high and low threshold voltages VOH and VOL.

In other words, when the subject pin of the DUT is properly in the high impedance mode, the analog comparators 10 and 20 generate the fail signals FHi and FLi. Thus, when the output of the analog comparator 10 is other than the fail signal FHi at the timing of the strobe signal STB1 or STB2, i.e., the output signal Si is higher than the high threshold voltage VOH, a fail signal is detected by the high HIZ detector. The fail signal is provided to the selector 91. Similarly, when the output of the analog comparator 20 is other than the fail signal FLi at the timing of the strobe signal STB1 or STB2, i.e., the output signal Si is lower than the low threshold voltage VOL, a fail signal is detected by the low HIZ detector. The fail signal is provided to the selector 92.

The selectors 91 and 92 selectively provide fail signals FHo and FLo to a logic comparator (not shown) wherein the fail signals are compared with expected value data generated by a test pattern generator in the semiconductor test system. The selectors 91 and 92 are preset to transfer the output signals of the high timing detector 50 and the low timing detector 60, respectively, when the mode commands are not given thereto. When the selectors 91 and 92 receive the mode command "WINDOW-MODE" or "HIZ-MODE" at their select signal inputs, the selectors 91 and 92 respectively select the corresponding outputs FHo or FLo of either from the window timing detector 70 or the HIZ detector 80.

In the foregoing conventional comparator, there is a limitation in detecting the fail or glitch in the high impedance mode. Such a limitation is explained in the following with reference to FIGS. 4A–4F. The high impedance mode command "HIZ-MODE" of FIG. 4A is given to the HIZ detector 80. As noted above, in the high impedance mode, the HIZ detector 80 is able to detect glitches or other fails which exist at the time of the strobe signal STB1 or STB2. The other fails in this case mean that the voltage level in the output signal Si exceeds the voltage range defined by the threshold voltages VOH and VOL for a relatively longer period of time than glitches.

Thus, the glitch (voltage higher than the high level threshold voltage VOH) in the output signal Si of the DUT shown in FIG. 4B or other fails can be detected by latching the same at the timing of the strobe signal STB1. Similarly, the glitch (voltage lower than the low level threshold voltage VOL) of in the output signal Si in FIG. 4C or other fails can be detected by latching the same at the timing of the strobe signal STB1.

However, the glitches or other fails shown in FIGS. 4D–4F cannot be detected in the conventional technology, because they are not in the timings of the strobe signals STB1 or STB2. The voltage wave form of FIG. 4E in the output signal Si indicates a fail in the high impedance state since the voltage level is higher than the threshold voltage VOH. Such a high impedance fail cannot be detected because the HIZ detector 80 is not able to latch the fail by the timing of the strobe signal STB1 or STB2. Similarly, the HIZ detector 80 cannot latch the glitches of FIG. 4D and 4F.

To detect the glitches or other fails in the high impedance mode of the DUT, the timings of the strobe signals STB1 and STB2 must be continuously changed to cover a desired timing length during the high impedance mode. Such a scanning method of the strobe signals requires a long time to fully test the desired time length especially when the time length to be inspected is large. For example, in the case where the time length to be inspected is 100 μs (microsecond) and each step for scanning the strobe signal is 50 ns (nanosecond), it is required to change the timings of the strobe signal two thousand (2,000) times.

As a consequence, the conventional comparator of FIG. 5 takes a substantially long time to fully evaluate the high impedance state of the output pin of the DUT, resulting in the deterioration of throughput in testing semiconductor devices. Furthermore, if a glitch occurs irregularly, it is virtually impossible to detect such a glitch.

SUMMARY OF THE INVENTION

Therefore, it is an object of the present invention to provide a comparator circuit to be used in a semiconductor test system which is capable of fully testing the output signal of a semiconductor device under test which is in a high impedance mode.

It is another object of the present invention to provide a comparator circuit to be used in a semiconductor test system which is capable of testing the output signal of the semiconductor device under test throughout the time range (window) specified by strobe signals.

It is a further object of the present invention to provide a comparator circuit to be used in a semiconductor test system which is capable of fully and quickly testing the output signal of the semiconductor device under test which is in a high impedance state.

It is a further object of the present invention to provide a comparator circuit to be used in a semiconductor test system which is capable of immediately detecting any deviations from the high impedance state or any glitches in the output of the DUT within the specified time range.

In the present invention, a comparator circuit includes a window high impedance detector which detects any glitches or fails in the output of the DUT when the DUT is in the high impedance state. The window high impedance detector is able to immediately detect such glitches or fails occur at any time during a time range (window period) specified by strobe signals.

In one aspect of the present invention, the comparator used in the semiconductor test system for testing a semiconductor device (DUT) includes a first analog comparator for receiving an output signal of the DUT and comparing the output signal with a high threshold voltage, a second analog comparator for receiving the output signal of the DUT and comparing the output signal with a low threshold voltage, and means for detecting a deviation from a high impedance state of the DUT throughout a specified time range and for producing a fail signal when the deviation is detected, wherein the deviation from the high impedance state is defined as a voltage of the output signal which exceeds a range between the high threshold voltage and the low threshold voltage.

In another aspect of the present invention, the comparator circuit in a semiconductor test system for testing a semiconductor device (DUT) includes a first analog comparator for receiving an output signal of the DUT and comparing the output signal with a high threshold voltage, a second analog comparator for receiving the output signal of the DUT and comparing the output signal with a low threshold voltage, a high timing detector connected to the first analog comparator for detecting a fail signal from the first analog comparator when the output signal of the DUT is lower than the high threshold voltage at a timing of a first strobe signal, a low timing detector connected to the second analog comparator for detecting a fail signal from the second analog comparator when the output signal of the DUT is higher than the low threshold voltage at a timing of a second strobe signal, a window timing detector connected to the first and second analog comparators for detecting a fail signal from the comparators during a time range defined by the first and second strobe signals, a high impedance detector connected to the first and second analog comparators for detecting a high impedance fail signal from the comparators at a timing of the first or second strobe signal, and a window high impedance detector connected to the first and second analog comparators for detecting a deviation from a high impedance state of the DUT during a time range specified by the first and second strobe signals.

The window high impedance detector includes an SR flip-flop which is provided with the first and second strobe signals to produce the specified time range defined by the first and second strobe signals, a first D flip-flop for latching a fail signal indicating the deviation from the high impedance state based on an output signal from the first analog signal, a second D flip-flop for latching a fail signal indicating the deviation from the high impedance state based on an output signal from the second analog signal, first gate means connected to the first analog comparator for supplying the output signal of the first analog comparator to the first D flip-flop within the specified time range, and second gate means connected to the second analog comparator for supplying the output signal of the second analog comparator to the second D flip-flop within the specified time range.

According to the present invention, the comparator circuit for a semiconductor test system is capable of fully testing the output signal of a semiconductor device under test in the high impedance mode. The comparator circuit can immediately detect glitches or fails occur in the output signal of the semiconductor device under test throughout the time range (window) specified by strobe signals. The comparator circuit of the resent invention is capable of fully and quickly testing the output signal of the semiconductor device under test in the high impedance state by immediately detecting any deviations from the high impedance state or any glitches within the specified time range.

BRIEF DESCRIPTION OF THE DRAWINGS

FIGS. 3A–3E are timing charts showing an operation of the comparator circuit of the present invention having the window high impedance detector of FIG. 2.

DESCRIPTION OF THE PREFERRED EMBODIMENT

Figure 1:
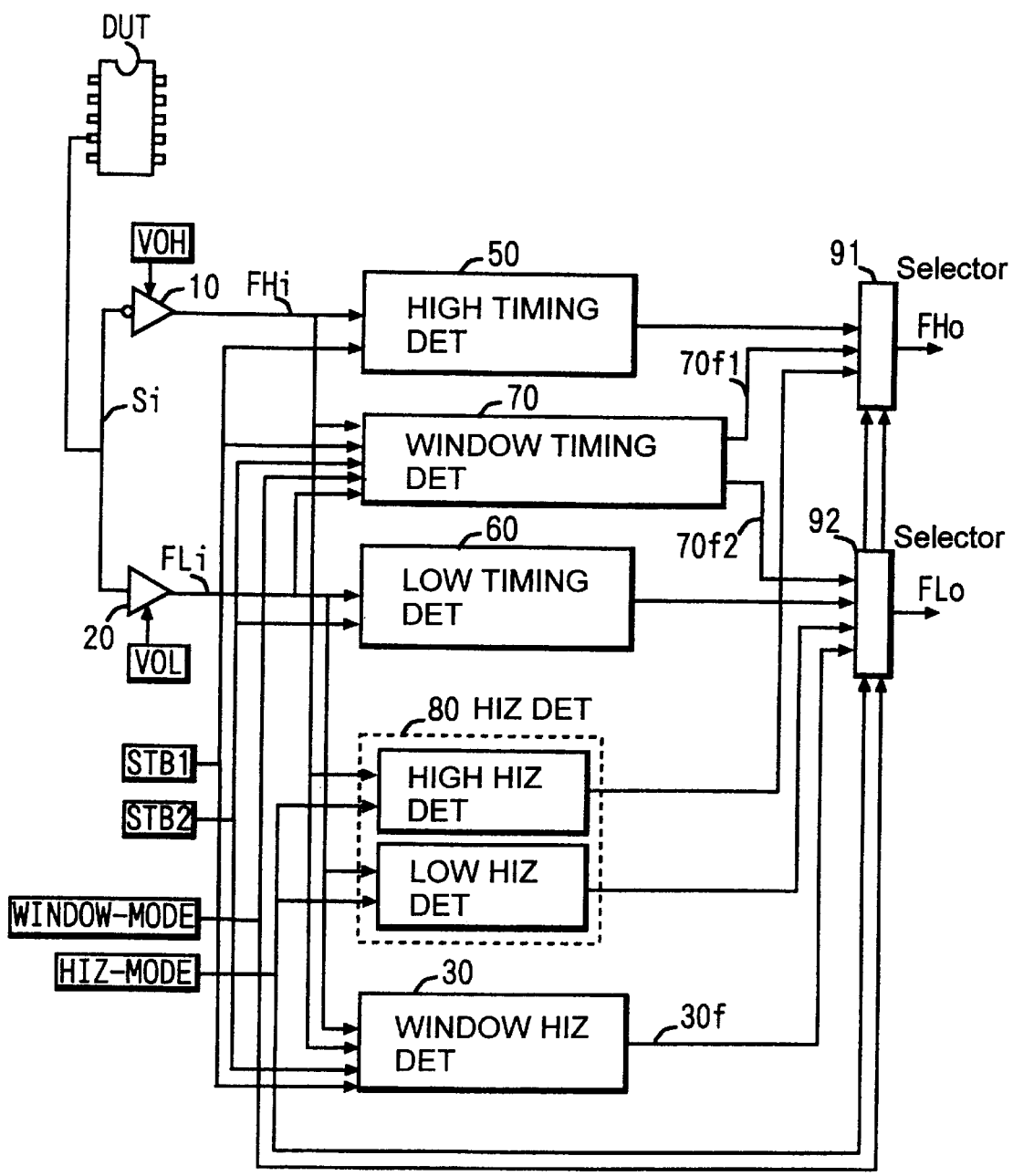
FIG. 1 is a block diagram showing a basic structure of the comparator circuit of the present invention to be used in a semiconductor test system.

A block diagram of FIG. 1 shows a basic structure of the comparator circuit of the present invention. The comparator circuit of FIG. 1 includes analog comparators 10 and 20, a high timing detector 50, a window timing detector 70, a low timing detector, a high impedance (HIZ) detector 80, a window high impedance (HIZ) detector 30, and selectors 91 and 92. The HIZ detector 80 includes a high level HIZ detector and a low level HIZ detector. The analog comparators 10 and 20 receive an output signal Si of the semiconductor device under test (DUT). In this arrangement, the window high impedance (HIZ) detector 30 latches any glitches or fails in the high impedance state of the DUT at any time during a time range (window period) specified by the strobes STB1 and STB2.

The analog comparator 10 is provided with a high threshold voltage VOH to determine whether the output signal Si of the DUT is higher than the threshold voltage VOH, i.e., a logic "1" or "high". Thus, when the output signal Si of the DUT is lower than the threshold voltage VOH, the analog comparator 10 generates a fail signal FHi. The analog comparator 20 is provided with a low threshold voltage VOL to determine whether the output signal Si of the DUT is lower than the low threshold voltage VOL, i.e., a logic "0" or "low". Thus, when the output signal Si of the DUT is higher than the threshold voltage VOL, the analog comparator 20 generates a fail signal FLi. As shown in FIG. 1, the outputs of the analog comparators 10 and 20 are respectively connected to the high timing detector 50, the window timing detector 70, the low timing detector 60, the high impedance (HIZ) detector 80, and the window high impedance (HIZ) detector 30.

The high timing detector 50 is to detect whether there exists a fail of a high voltage level at the timing of the strobe signal STB1. When such a fail is found, the fail signal FHi from the analog comparator 10 is latched by the edge timing of the strobe STB1, which is provided to the selector 91. The low timing detector 60 is to detect whether there exists a fail of a low voltage level at the timing of the strobe signal STB2. Thus, when such a fail is found, the fail signal FLi from the analog comparator 20 is latched by the edge timing of the strobe STB2, and is provided to the selector 92.

The window timing detector 70 is to determine whether there exist any fails or glitches during a window period defined by the strobe signals STB1 and STB2. The window timing detector 70 is effective when a window strobe mode command "WINDOW-MODE" is active. When any high level fails or high level glitches are detected, a high glitch detection signal 70f1 is produced at the output of the detector 70, which is provided to the selector 91. When any low level fails or low level glitches are detected, a low glitch detection signal 70f2 is produced at the output of the detector 70, which is provided to the selector 92.

The high impedance (HIZ) detector 80 is to determine whether the subject pin of the DUT is in a high impedance state at the timing of the strobe signals STB1 and STB2. The HIZ detector 80 is effective when a high impedance mode command "HIZ-MODE" is active. As noted above with respect to the conventional technology, in the high impedance state of the pin, the DUT is so designed that the output signal Si of the pin remains within the voltage range between the high and low threshold voltages VOH and VOL.

Therefore, when the subject pin of the DUT is properly in the high impedance mode, the analog comparators 10 and 20 generate the fail signals FHi and FLi. When the output of the analog comparator 10 is other than the fail signal FHi at the timing of the strobe signal STB1 or STB2, i.e., the output signal Si is higher than the high threshold voltage VOH, a fail signal is detected by the high HIZ detector. The fail signal is provided to the selector 91. When the output of the analog comparator 10 is other than the fail signal FLi at the timing of the strobe signal STB1 or STB2, i.e., the output signal Si is lower than the low threshold voltage VOL, a fail signal is detected by the low HIZ detector. The fail signal is provided to the selector 92.

The window HIZ detector 30 is to determine whether the subject pin of the DUT is in a high impedance state during a time range (window period) specified by the strobe signals STB1 and STB2. During the specified time range, the window HIZ detector 30 detects any voltages (glitch or failure of high impedance state) outside of the voltage range defined by the high threshold voltage VOH and the low threshold voltage VOL. Thus, the moment such a glitch or failure of high impedance state occurs within the specified time range, the window HIZ detector 30 latches such a glitch or failure and provides the latched fail signal 30f to the selector 92.

The selectors 91 and 92 selectively provide fail signals FHo and FLo to a logic comparator (not shown) wherein the fail signals are compared with expected value data generated by a test pattern generator in the semiconductor test system. The selectors 91 and 92 are preset to transfer the output signals of the high timing detector 50 and the low timing detector 60, respectively, when the mode commands are not given thereto. When the selectors 91 and 92 receive the mode command "WINDOW-MODE" or "HIZ-MODE" at their signal inputs, the selectors 91 and 92 respectively transmit the corresponding outputs FHo or FLo of either from the window timing detector 70 or the HIZ detector 80.

The selector 92 is further connected to the output of the window HIZ detector 30 to provide the fail output FLo selected from the outputs of the window timing detector 70, the HIZ detector 80, or the window HIZ detector 30. For example, when both the mode commands "WINDOW-MODE" and "HIZ-MODE" are active, the selector 92 transfers the output of the window HIZ detector 30. As a consequence, the glitch or other fail in the high impedance state of the DUT can be immediately detected without regard to the timing of the strobe signals STB1 and STB2.

Figure 2:
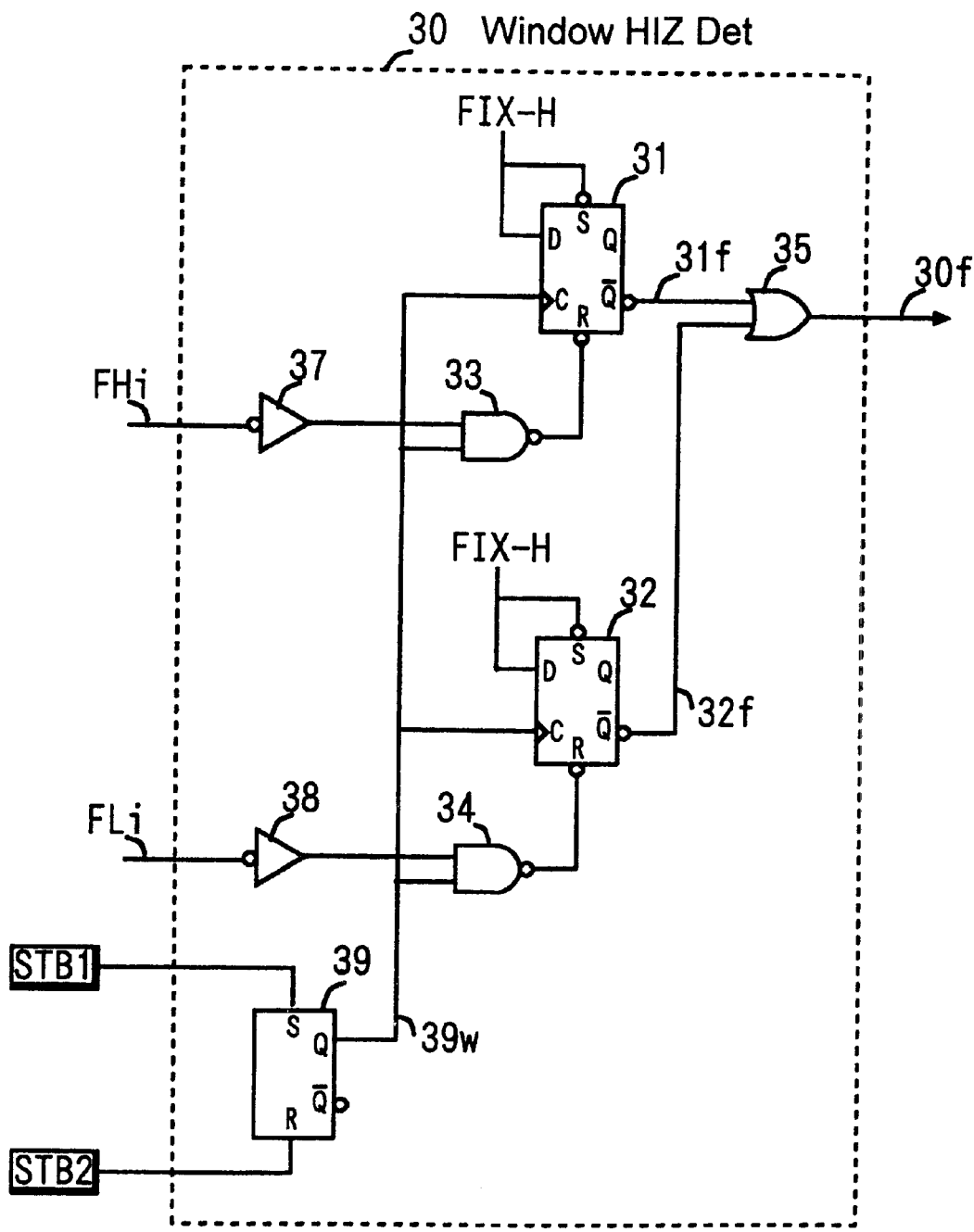
FIG. 2 is a circuit diagram showing an example of structure of the window high impedance detector to be used in the comparator circuit of the present invention.
Figure 4A:
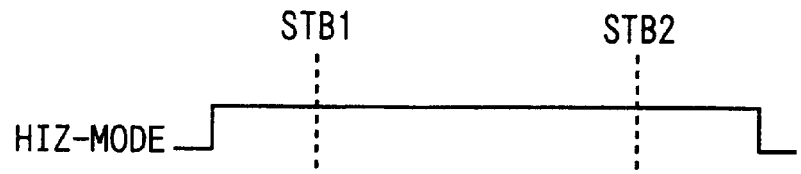
FIGS. 4A–4F are timing charts showing an operation of the comparator circuit of conventional technology wherein certain glitches are not detectable.
Figure 4B:
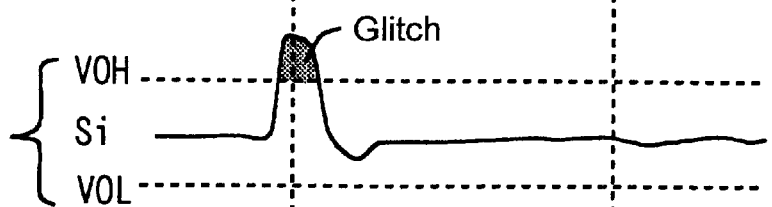
Figure 4C:
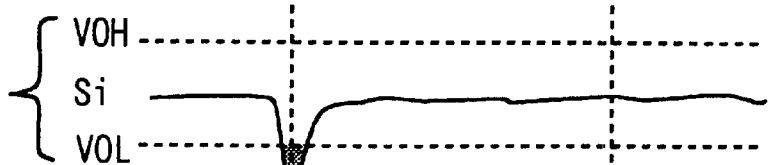
Figure 4D:
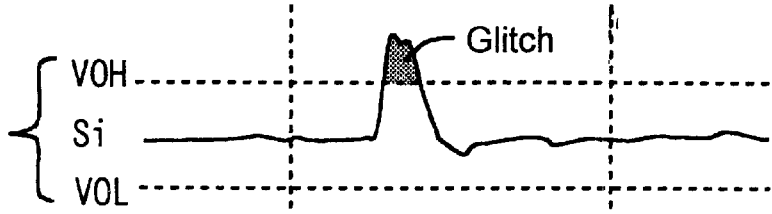
Figure 4E:
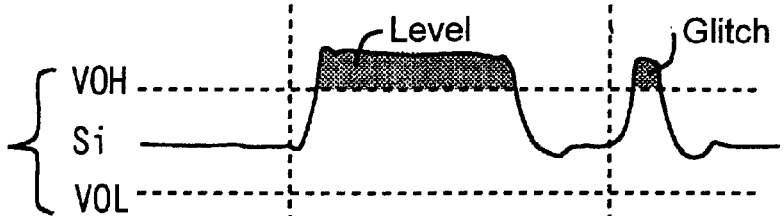
Figure 4F:
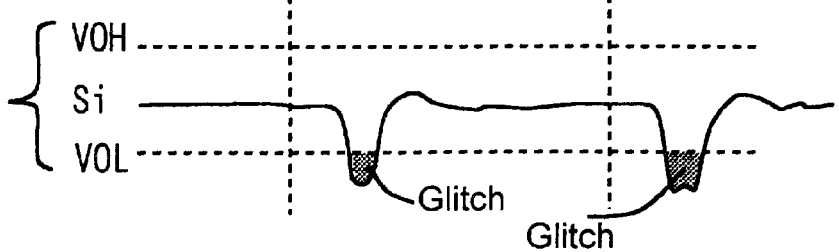
Figure 5:
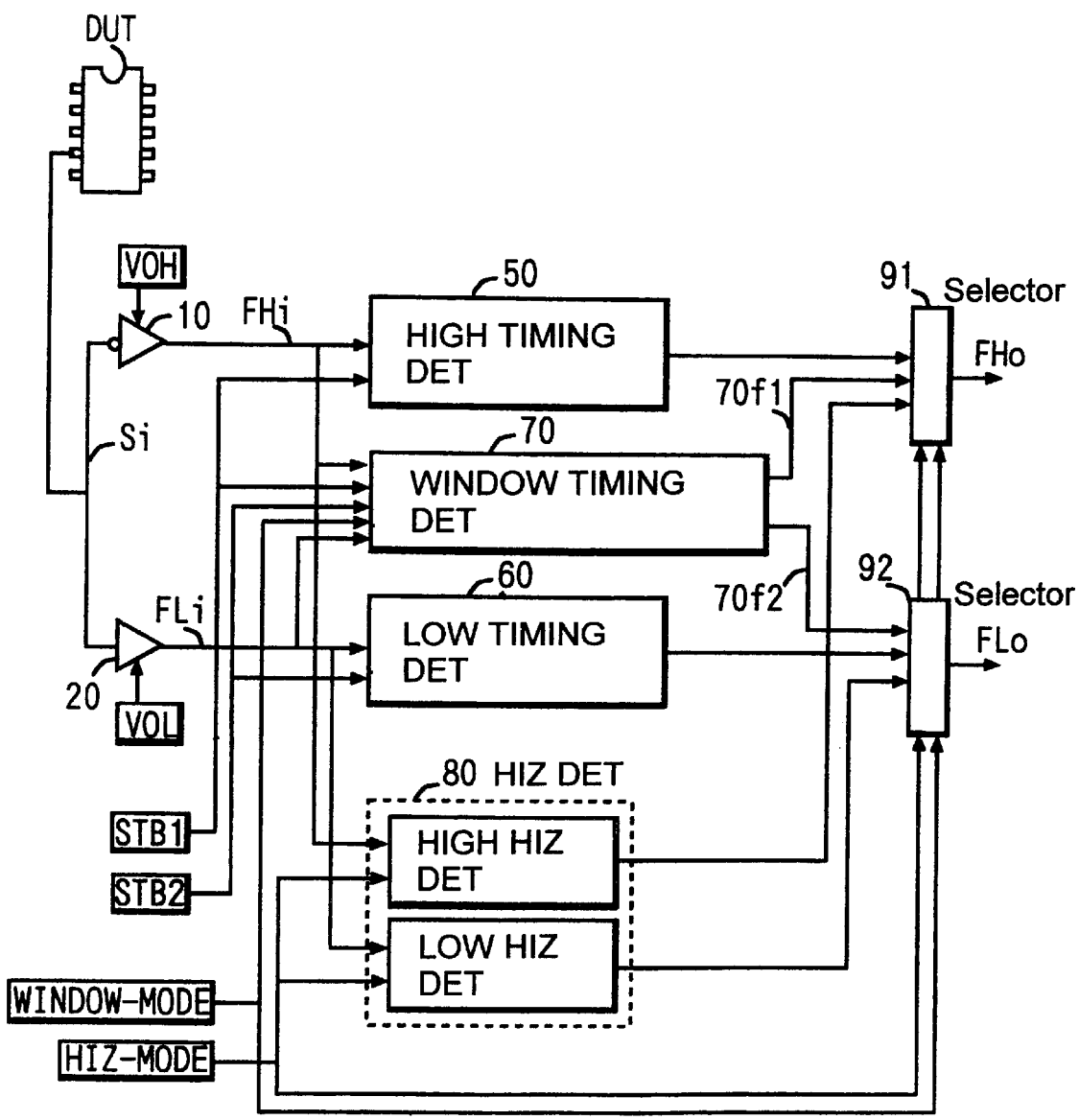
FIG. 5 is a block diagram showing an example of basic structure of the comparator circuit in the conventional technology used in a semiconductor test system.

An example of structure of the window HIZ detector 30 to be used in the comparator circuit of the present invention is shown in the circuit diagram of FIG. 2. The window HIZ detector 30 includes D flip-flops 31 and 32, NAND gates 33 and 34, an OR gate 35, inverters 37 and 38, and an SR flip-flop 39. The OR gate 35 generates the fail signal 30f when receiving the latched fail signal 31f from the D flip-flop 31 or the latched fail signal 32f from the D flip-flop 32. The D flip-flops 31 and 32 are provided with high level inputs at the set terminals S.

With reference to FIGS. 2 and 3A–3E, the operation of the window HIZ detector 30 is as follows. For example, when the high impedance command "HIZ-MODE" as shown in FIG. 3A is active, the output of the detector 30 is selected by the selector 92. The SR flip-flop 39 is set by the strobe signal STB1 and reset by the strobe signal STB2. Thus, the output signal 39w of the SR flip-flop 39 shows a time range (window period) specified by the strove signals STB1 and STB2 as shown in FIG. 3B. The window signal 39w clears the flip-flops 31 and 32 by its start edge so that the flip-flops 31 and 32 do not produce any fail outputs at the start of the window period as shown in FIG. 3E.

The output of the analog comparator 10 is connected to an input of the NAND gate 33 through the inverter 37. The other input of the NAND gate 33 is provided with the window signal 39w. The output of the NAND gate 33 is connected to the reset terminal of the D flip-flop 31. Thus, in the case where a fail signal FHi from the analog comparator 10 is received by the NAND gate 33 at any time during the window signal 39w is active, the D flip-flop 31 is immediately reset. Namely, the fail signal is latched by the window HIZ detector 30, thereby producing a fail signal 31f.

Similarly, the output of the analog comparator 2Q is connected to an input of the NAND gate 34 through the inverter 38. The other input of the NAND gate 34 is provided with the window signal 39w. The output of the NAND gate 34 is connected to the reset terminal of the D flip-flop 32. Thus, in the case where a fail signal FLi from the analog comparator 20 is received by the NAND gate 34 at any time during the window signal 39w is active, the D flip-flop 32 is, immediately reset. Namely, the fail signal is latched by the window HIZ detector 30, thereby producing a fail signal 32f.

For example, if the output signal of the DUT includes a glitch as shown FIG. 3C within the window period (the time range defined by the strobe signals STB1 and STB2), the comparator 10 changes the state of the output FHi as shown in FIG. 3D. As noted above, in the high impedance mode of the DUT, the output voltage of the pin in question should be within the voltage range specified by the high threshold VOH and low threshold VOL. Thus, in the high impedance mode, the glitch of FIG. 3C exceeds the voltage range and is considered to be a failure of the DUT. Because of this glitch, the output FHi of the analog comparator 10 changes to the low level as in FIG. 3D which resets the D flip-flop 31. As a consequence, the D flip-flop 31 latches the fail and produces a fail signal 31f of FIG. 3E.

The OR gate 35 generates the fail signal 30f when receiving the latched fail signal 31f from the D flip-flop 31 or the latched fail signal 32f from the D flip-flop 32. The selector 92 of FIG. 1 selects the fail signal 30f when the selector 92 receives, for example, both the HIZ command "HIZ-MODE" and the window command "WINDOW-MODE" as a select signal. The selected fail signal 30f is provided to a logic comparator (not shown) to be compared with the expected logic data produced by the semiconductor test system.

Figure 6:
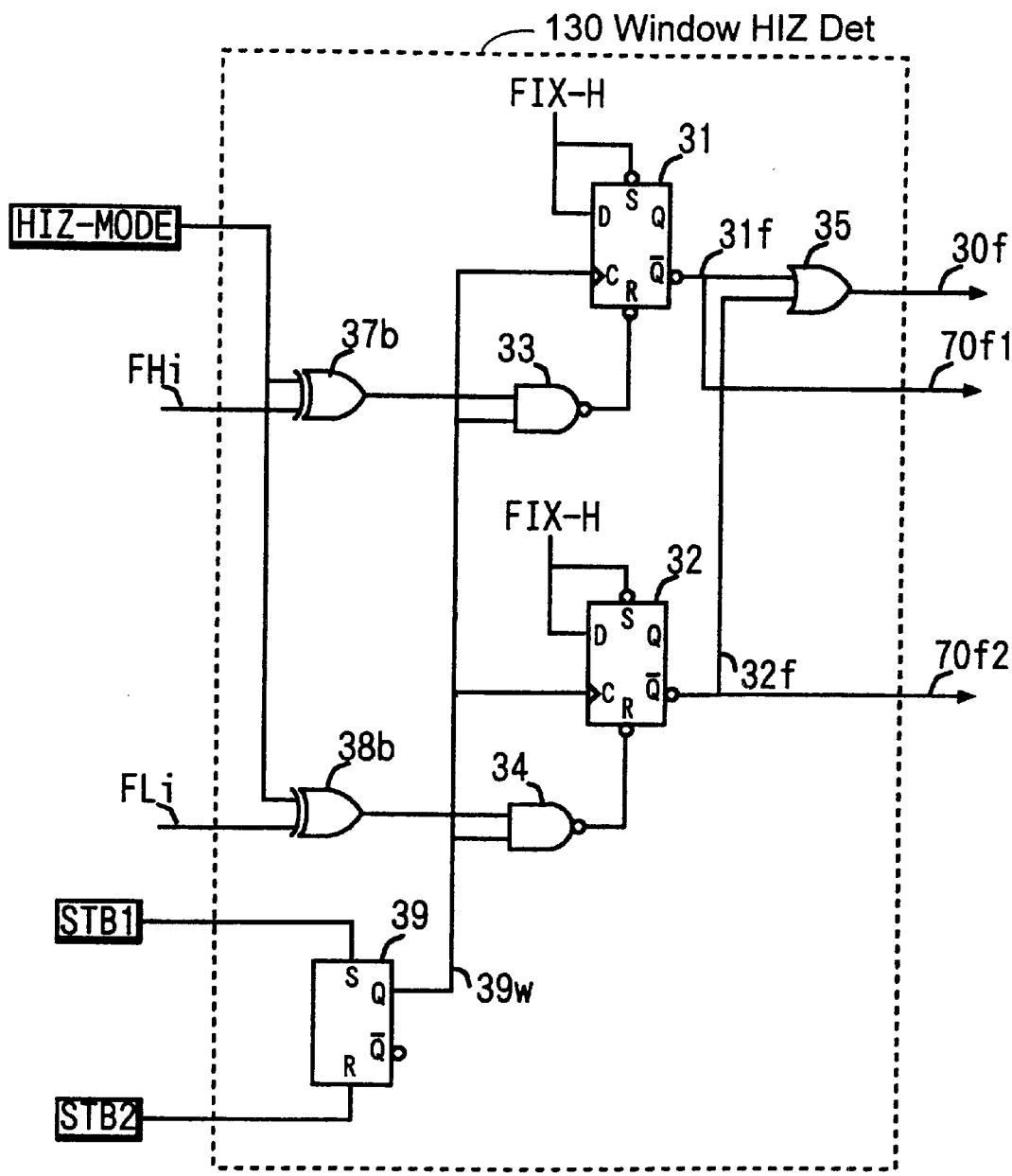
FIG. 6 is a circuit diagram showing another example of structure of the window high impedance detector to be used in the comparator circuit of the present invention.

FIG. 6 is a circuit diagram showing another example of the window HIZ detector in the comparator circuit of the present invention. The window HIZ detector 130 of FIG. 6 is designed to function as both the window timing detector 70 and the window HIZ detector 30 in FIG. 1. In this example, the inverters 37 and 38 of FIG. 2 are replaced with exclusive OR circuits 37b and 38b. The exclusive OR circuits 37b and 38b are provided with the high impedance command "HIZ-MODE" such as shown in FIG. 3A when functions as the window HIZ detector 30. The high impedance command "HIZ-MODE" is inactive when the detector 130 functions as the window timing detector 70.

According to the present invention, the comparator circuit for a semiconductor test system is capable of fully testing the output signal of a semiconductor device under test in the high impedance mode. The comparator circuit can immediately detect glitches or fails occur in the output signal of the semiconductor device under test throughout the time range (window) specified by strobe signals. The comparator circuit of the present invention is capable of fully and quickly testing the output signal of the semiconductor device under test in the high impedance state by immediately detecting any deviations from the high impedance state or any glitches within the specified time range.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A comparator circuit in a semiconductor test system for testing a semiconductor device (DUT), comprising:
    a first analog comparator for receiving an output signal of the DUT and comparing the output signal with a high threshold voltage;
    a second analog comparator for receiving the output signal of the DUT and comparing the output signal with a low threshold voltage;
    a high timing detector connected to the first analog comparator for detecting a fail signal from the first analog comparator when the output signal of the DUT is lower than the high threshold voltage at a timing of a first strobe signal;
    a low timing detector connected to the second analog comparator for detecting a fail signal from the second analog comparator when the output signal of the DUT is higher than the low threshold voltage at a timing of a second strobe signal;
    a window timing detector connected to the first and second analog comparators for detecting a fail signal from the comparators during a time range defined by the first and second strobe signals;
    a high impedance detector connected to the first and second analog comparators for detecting a high impedance fail signal from the first and second analog comparators at a timing of the first or second strobe signal; and
    a window high impedance detector connected to the first and second analog comparators for detecting a deviation from a high impedance state of the DUT during a time range specified by the first and second strobe signals.

2. A comparator circuit as defined in claim 1, wherein the deviation from the high impedance state is defined as a situation in which a voltage of the output signal of the DUT which exceeds a voltage range between the high threshold voltage and the low threshold voltage.

3. A comparator circuit as defined in claim 1, wherein the high threshold voltage provided to the first analog comparator is to determine whether the output signal of the DUT is in a logic "1" state and the low threshold voltage provided to the second analog comparator is to determine whether the output signal of the DUT is in a logic "0" state.

4. A comparator circuit as defined in claim 1, further including a selector for selecting fail signals from the high timing detector, low timing detector, window timing detector, high impedance detector or window high impedance detector based on select signals for providing the selected fail signal to a logic comparator.

5. A comparator circuit as defined in claim 1, wherein the window high impedance detector is comprised of:

- an SR flip-flop which is provided with the first and second strobe signals to produce the specified time range defined by the first and second strobe signals;
- a first flip-flop for latching a fail signal indicating the deviation from the high impedance state based on an output signal from the first analog signal;
- a second flip-flop for latching a fail signal indicating the deviation from the high impedance state based on an output signal from the second analog signal;
- first gate means connected to the first analog comparator for supplying the output signal of the first analog comparator to the first flip-flop within the specified time range; and
- second gate means connected to the second analog comparator for supplying the output signal of the second analog comparator to the second flip-flop within the specified time range.

6. A comparator circuit as defined in claim 5, wherein the window high impedance detector further includes an OR gate to transmit an output signal from the first flip-flop or the second flip-flop.

7. A comparator circuit as defined in claim 5, wherein the first gate means in the window high impedance detector is formed with a first inverter and a first NAND gate, and the second gate means in the window high impedance detector is formed with a second inverter and a second NAND gate.

8. A comparator circuit as defined in claim 5, wherein the first gate means in the window high impedance detector is formed of a first exclusive OR gate and a first NAND gate, and the second gate means in the window high impedance detector is formed of a second exclusive OR gate and a second NAND gate.

* * * * *